(12) United States Patent
Boner

(10) Patent No.: US 6,625,763 B1
(45) Date of Patent: Sep. 23, 2003

(54) BLOCK INTERLEAVER AND DE-INTERLEAVER WITH BUFFER TO REDUCE POWER CONSUMPTION

(75) Inventor: Alon Boner, El-Yachin (IL)

(73) Assignee: 3G.com, Inc., Lexington, MA (US)

( * ) Notice: Subject to any disclaimer, the term of this patent is extended or adjusted under 35 U.S.C. 154(b) by 598 days.

(21) Appl. No.: 09/610,302

(22) Filed: Jul. 5, 2000

(51) Int. Cl.[7] ............ G06F 11/00; H03M 7/00
(52) U.S. Cl. .......... 714/701; 714/701; 714/702; 341/81; 711/217
(58) Field of Search .............. 714/701, 699, 714/702; 341/81; 711/217

(56) References Cited

U.S. PATENT DOCUMENTS

| | | | | |
|---|---|---|---|---|
| 3,652,998 A | * | 3/1972 | Forney, Jr. et al. ........... | 377/64 |
| 6,347,385 B1 | * | 2/2002 | Cui et al. ................. | 714/701 |
| 6,507,629 B1 | * | 1/2003 | Hatakeyama .............. | 375/372 |
| 6,543,013 B1 | * | 4/2003 | Li et al. .................. | 714/701 |

* cited by examiner

*Primary Examiner*—Emmanuel L. Moise
(74) *Attorney, Agent, or Firm*—Bever, Hoffman & Harms, LLP; E. Eric Hoffman

(57) ABSTRACT

A block interleaver is provided using a relatively small register file and a larger random access memory (RAM). In one embodiment, the size of the RAM is larger than the size of the register file by at least one order of magnitude. As a result, the register file consumes significantly less power than the RAM for similar operations. The register file receives a stream of sequential data values and stores the data values in a column order. The data values are then read from the register file in a row order. The data values read from the register file in a row order are then written to the RAM in a row order. The data values are then read from the RAM in a row order, thereby creating an interleaved data stream. In a particular embodiment, the data values are written to the RAM in a staggered row order and read from the RAM in a sequential row order. All accesses to the RAM are performed using the full width of the RAM, such that no unnecessary power is used to access the RAM. The register file consumes significantly less power than the RAM, thereby providing an overall power savings for the interleaving process. In different embodiments, the register file can be a single-port device or a dual-port device. A similar block de-interleaver is provided in another embodiment.

36 Claims, 11 Drawing Sheets

FIG. 1 (PRIOR ART)

| | C0 | C1 | C2 | C3 | |
|---|---|---|---|---|---|
| R0 | $D_0$ | $D_1$ | $D_2$ | $D_3$ | |
| R1 | $D_4$ | $D_5$ | $D_6$ | $D_7$ | |
| R2 | $D_8$ | $D_9$ | $D_{10}$ | $D_{11}$ | |
| R3 | $D_{12}$ | $D_{13}$ | $D_{14}$ | $D_{15}$ | |
| R4 | $D_{16}$ | $D_{17}$ | $D_{18}$ | $D_{19}$ | |
| R5 | $D_{20}$ | $D_{21}$ | $D_{22}$ | $D_{23}$ | |
| R6 | $D_{24}$ | $D_{25}$ | $D_{26}$ | $D_{27}$ | |
| R7 | $D_{28}$ | $D_{29}$ | $D_{30}$ | $D_{31}$ | |
| R8 | $D_{32}$ | $D_{33}$ | $D_{34}$ | $D_{35}$ | |
| R9 | $D_{36}$ | $D_{37}$ | $D_{38}$ | $D_{39}$ | |
| R10 | $D_{40}$ | $D_{41}$ | $D_{42}$ | $D_{43}$ | |
| R11 | $D_{44}$ | $D_{45}$ | $D_{46}$ | $D_{47}$ | |
| R12 | $D_{48}$ | $D_{49}$ | $D_{50}$ | $D_{51}$ | |
| R13 | $D_{52}$ | $D_{53}$ | $D_{54}$ | $D_{55}$ | |
| R14 | $D_{56}$ | $D_{57}$ | $D_{58}$ | $D_{59}$ | |
| R15 | $D_{60}$ | $D_{61}$ | $D_{62}$ | $D_{63}$ | |
| R16 | $D_{64}$ | $D_{65}$ | $D_{66}$ | $D_{67}$ | |
| R17 | $D_{68}$ | $D_{69}$ | $D_{70}$ | $D_{71}$ | |
| R18 | $D_{72}$ | $D_{73}$ | $D_{74}$ | $D_{75}$ | |
| R19 | $D_{76}$ | $D_{77}$ | $D_{78}$ | $D_{79}$ | |
| R20 | $D_{80}$ | $D_{81}$ | $D_{82}$ | $D_{83}$ | |
| R21 | $D_{84}$ | $D_{85}$ | $D_{86}$ | $D_{87}$ | |
| R22 | $D_{88}$ | $D_{89}$ | $D_{90}$ | $D_{91}$ | |
| R23 | $D_{92}$ | $D_{93}$ | $D_{94}$ | $D_{95}$ | |
| R24 | $D_{96}$ | $D_{97}$ | $D_{98}$ | $D_{99}$ | |
| R25 | $D_{100}$ | $D_{101}$ | $D_{102}$ | $D_{103}$ | |
| R26 | $D_{104}$ | $D_{105}$ | $D_{106}$ | $D_{107}$ | |
| R27 | $D_{108}$ | $D_{109}$ | $D_{110}$ | $D_{111}$ | |
| R28 | $D_{112}$ | $D_{113}$ | $D_{114}$ | $D_{115}$ | |
| R29 | $D_{116}$ | $D_{117}$ | $D_{118}$ | $D_{119}$ | |
| R30 | $D_{120}$ | $D_{121}$ | $D_{122}$ | $D_{123}$ | |
| R31 | $D_{124}$ | $D_{125}$ | $D_{126}$ | $D_{127}$ | |

| | C0 | C1 | C2 | C3 | |
|---|---|---|---|---|---|
| R0 | $D_0$ | $D_4$ | $D_8$ | $D_{12}$ | |
| R1 | $D_{16}$ | $D_{20}$ | $D_{24}$ | $D_{28}$ | |
| R2 | $D_{32}$ | $D_{36}$ | $D_{40}$ | $D_{44}$ | |
| R3 | $D_{48}$ | $D_{52}$ | $D_{56}$ | $D_{60}$ | |
| R4 | $D_{64}$ | $D_{68}$ | $D_{72}$ | $D_{76}$ | |
| R5 | $D_{80}$ | $D_{84}$ | $D_{88}$ | $D_{92}$ | |
| R6 | $D_{96}$ | $D_{100}$ | $D_{104}$ | $D_{108}$ | |
| R7 | $D_{112}$ | $D_{116}$ | $D_{120}$ | $D_{124}$ | |
| R8 | $D_1$ | $D_5$ | $D_9$ | $D_{13}$ | |
| R9 | $D_{17}$ | $D_{21}$ | $D_{25}$ | $D_{29}$ | |
| R10 | $D_{33}$ | $D_{37}$ | $D_{41}$ | $D_{45}$ | |
| R11 | $D_{49}$ | $D_{53}$ | $D_{57}$ | $D_{61}$ | |
| R12 | $D_{65}$ | $D_{69}$ | $D_{73}$ | $D_{77}$ | |
| R13 | $D_{81}$ | $D_{85}$ | $D_{89}$ | $D_{93}$ | |
| R14 | $D_{97}$ | $D_{101}$ | $D_{105}$ | $D_{109}$ | |
| R15 | $D_{113}$ | $D_{117}$ | $D_{121}$ | $D_{125}$ | |
| R16 | $D_2$ | $D_6$ | $D_{10}$ | $D_{14}$ | |
| R17 | $D_{18}$ | $D_{22}$ | $D_{26}$ | $D_{30}$ | |
| R18 | $D_{34}$ | $D_{38}$ | $D_{42}$ | $D_{46}$ | |
| R19 | $D_{50}$ | $D_{54}$ | $D_{58}$ | $D_{62}$ | |
| R20 | $D_{66}$ | $D_{70}$ | $D_{74}$ | $D_{78}$ | |
| R21 | $D_{82}$ | $D_{86}$ | $D_{90}$ | $D_{94}$ | |
| R22 | $D_{98}$ | $D_{102}$ | $D_{106}$ | $D_{110}$ | |
| R23 | $D_{114}$ | $D_{118}$ | $D_{122}$ | $D_{126}$ | |
| R24 | $D_3$ | $D_7$ | $D_{11}$ | $D_{15}$ | |
| R25 | $D_{19}$ | $D_{23}$ | $D_{27}$ | $D_{31}$ | |
| R26 | $D_{35}$ | $D_{39}$ | $D_{43}$ | $D_{47}$ | |
| R27 | $D_{51}$ | $D_{55}$ | $D_{59}$ | $D_{63}$ | |
| R28 | $D_{67}$ | $D_{71}$ | $D_{75}$ | $D_{79}$ | |
| R29 | $D_{83}$ | $D_{87}$ | $D_{91}$ | $D_{95}$ | |
| R30 | $D_{99}$ | $D_{103}$ | $D_{107}$ | $D_{111}$ | |
| R31 | $D_{115}$ | $D_{119}$ | $D_{123}$ | $D_{127}$ | |

200

BLOCK INTERLEAVER AND DE-INTERLEAVER WITH BUFFER TO REDUCE POWER CONSUMPTION

FIELD OF THE INVENTION

The present invention relates to block interleaver and de-interleaver structures for changing the orders of values in a data stream.

RELATED ART

Interleavers are memory structures widely used in wireless communications, where streams of data (e.g., voice data) must be transmitted through the air from a source device to a receiver. Groups of sequential bits in these streams of data are subject to noise errors (i.e., value changes during transmission) in the presence of a burst noise event or during fading of the transmission signal.

To protect against noise, conventional systems implement error correction schemes in which the source device adds redundant bits to the data stream, and the receiver implements an algorithm to detect and correct noise errors. Most error correction schemes work reasonably well as long as the erroneous bits are spread throughout the bit stream (after the addition of the error-correction bits). Unfortunately, these error correction schemes fail to correct continuous sequences of erroneous bits.

An interleaver/de-interleaver system is typically used to enable the correction of continuous sequences of erroneous bits in the transmitted data stream. In such a system, an interleaver is provided in the source device to scramble the order of the bits of the data stream prior to transmission. A de-interleaver is provided in the receiver to de-scramble the order of the bits after transmission, thereby reconstructing the data stream in the original order. A noise event occurring during transmission will therefore corrupt sequential bits in the scrambled data stream, which correspond with non-sequential bits in the original data stream. Thus, after the de-interleaver de-scrambles the order of the bits, the erroneous bits will be spread throughout the data stream. A conventional error correction scheme can then be applied to the data stream provided by the de-interleaver to correct the erroneous bits. A basic description of interleavers is provided in U.S. Pat. No. 3,652,998 by Forney.

A commonly used method of interleaving is block interleaving. In this method, the data to be transmitted is divided to blocks, typically of equal length. Each block is interleaved separately. At the receiver, blocks are de-interleaved and concatenated again to form a continuous bit stream.

In a simple interleaving scheme, a special random access memory (RAM) is used to perform the interleaving. Sequential data values are written into the RAM in row order, and then read out of the RAM in column order. In this manner, the sequential data values are scrambled. For example, sequential data values D1–D12 would be written into a 3×4 RAM in row order as defined below in Table 1.

TABLE 1

|       | Column 1 | Column 2 | Column 3 |
|-------|----------|----------|----------|
| Row 1 | D1       | D2       | D3       |
| Row 2 | D4       | D5       | D6       |

TABLE 1-continued

|       | Column 1 | Column 2 | Column 3 |
|-------|----------|----------|----------|
| Row 3 | D7       | D8       | D9       |
| Row 4 | D10      | D11      | D12      |

When the data values are sequentially read from columns 1, 2 and 3 of the RAM (i.e., in column order), the order of the data values D1–D12 will be: D1, D4, D7, D10, D2, D5, D8, D11, D3, D6, D9, and D12. This is the order in which the data values are transmitted.

Although Table 1 defines a block interleaver having a size of twelve bits, in practice, much longer interleaver blocks are used to protect against longer bursts of noise and fading periods. For example, interleaver blocks of more than 20,000 bits are used in most of the $3^{rd}$ generation telephony standards (when high bit rates are transmitted).

More complex block interleaver schemes include permutation of order in which the columns are read. For example, data values might be sequentially read from columns 1, 3 and 2 of the RAM. In this case, the order of the transmitted data values will be D1, D4, D7, D10, D3, D6, D9, D12, D2, D5, D8 and D11.

Static RAM (SRAM) devices are typically used to implement block interleavers. Because an access of a large SRAM device consumes a relatively high power, it is desirable to minimize the number of SRAM accesses in the process of block interleaving.

In general, power consumption of an SRAM device may be reduced if the memory word width is large, so that several bits are accessed at the same time. But for a block interleaver, the SRAM device is written in rows and read in columns. If the SRAM block interleaver is arranged so that each row stores one or more memory words, then each write operation to the SRAM block interleaver can be performed one or more word at a time, in a power-efficient manner. However, read operations from the SRAM block interleaver must be performed in a per-column manner, with one memory-read cycle required for every bit read (a full word will be read, but only one of the bits will be used).

Returning to Table 1, and assuming a word length of 3 bits (a full row), the block interleaver will be written during four cycles. Thus, during a first cycle, data values D1–D3 are written to Row 1, during a second cycle, data values D4–D6 are written to Row 2, during a third cycle, data values D7–D9 are written to Row 3, and during a fourth cycle, data values D10–D12 are written to Row 4.

It will take twelve cycles to extract the twelve data values D1–D12 from the block interleaver. Table 2 defines these twelve cycles.

TABLE 2

| Cycle | Action |
|-------|--------|
| 1 | Extract D1 by reading Row 1 (D1, D2, D3) and ignoring D2, D3 |
| 2 | Extract D4 by reading Row 2 (D4, D5, D6) and ignoring D5, D6 |
| 3 | Extract D7 by reading Row 3 (D7, D8, D9) and ignoring D8, D9 |
| 4 | Extract D10 by reading Row 4 (D10, D11, D12) and ignoring D11, D12 |
| 5 | Extract D2 by reading Row 1 (D1, D2, D3) and ignoring D1, D3 |
| 6 | Extract D5 by reading Row 2 (D4, D5, D6) and ignoring D4, D6 |

TABLE 2-continued

| Cycle | Action |
|---|---|
| 7 | Extract D8 by reading Row 3 (D7, D8, D9) and ignoring D7, D9 |
| 8 | Extract D11 by reading Row 4 (D10, D11, D12) and ignoring D10, D12 |
| 9 | Extract D3 by reading Row 1 (D1, D2, D3) and ignoring D1, D2 |
| 10 | Extract D6 by reading Row 2 (D4, D5, D6) and ignoring D4, D5 |
| 11 | Extract D9 by reading Row 3 (D7, D8, D9) and ignoring D7, D8 |
| 12 | Extract D12 by reading Row 4 (D10, D11, D12) and ignoring D10, D11 |

In general, if the word length is W and the block interleaver memory size is M bits, where M is a multiple of W, then an interleaving procedure will have a duration of M/W write cycles and M read cycles.

If an SRAM block interleaver is selected where columns are configured to store words, then M/W read cycles will be required, thereby making the read operations more efficient. However, such a configuration would require M write cycles, thereby making the write operations less efficient. As a result, power consumption will remain high.

It would therefore be desirable to have a block interleaver capable of overcoming the deficiencies of the described prior art, thereby exhibiting reduced power consumption.

SUMMARY

The present invention provides a block interleaver that includes a relatively small register file and a larger interleaver RAM. In one embodiment, the size of the interleaver RAM is larger than the size of the register file by at least one order of magnitude. As a result, the register file consumes significantly less power than the interleaver RAM for similar operations.

The register file is used for intermediate storage of the data values (bits or symbols) in a sequential input data stream. Data values to be written into the interleaver RAM are first written to the register file in a column order. Then, the data values are transferred from the register file to the interleaver RAM in a row order. This transfer is performed using write operations to the interleaver RAM, wherein the width of the write operations is equal to the full width of the interleaver RAM. In one embodiment, the data values are written to the interleaver RAM in a staggered row order. In another embodiment, the data values are written to the interleaver RAM in a row order, which is selected to implement a permutation of a column order of the original data stream.

Data values are then read from the interleaver RAM in a row order, thereby creating an interleaved data stream. Each of these read operations has a width equal to the full width of the interleaver RAM. In a particular embodiment, the data values are read from the interleaver RAM in a sequential row order.

Because all read and write accesses to the interleaver RAM are performed using the full width of the interleaver RAM, no unnecessary power is used to transfer data values through the RAM. The register file consumes significantly less power than the RAM, thereby providing an overall power savings for the interleaving process. In addition, the interleaver RAM enables faster transfer rates as the read and write operations are performed in words and not in bits. In different embodiments, the register file can be a single-port device, a dual-port device, or multiple devices.

In another embodiment, the present invention provides a block de-interleaver that includes a relatively small register file and a larger de-interleaver RAM. Data values from an interleaved data stream are first written to the de-interleaver RAM in a first row order. The width of these write operations is equal to the full width of the de-interleaver RAM. Then, the data values are transferred from the de-interleaver RAM to the register file in a second row order. This transfer is performed using read operations from the de-interleaver RAM, wherein the width of these read operations is equal to the full width of the de-interleaver RAM. In one embodiment, the first row order is a sequential row order and the second row order is a staggered row order. In another embodiment, the second row order is selected to eliminate a column permutation present in the interleaved data stream.

Data values are then read from the register file in a column order, thereby providing a de-interleaved data stream. Because all read and write accesses to the interleaver RAM are performed using the full width of the interleaver RAM, no unnecessary power is used to transfer data values through the RAM. The register file consumes significantly less power than the RAM, thereby providing an overall power savings for the interleaving process. In different embodiments, the register file can be a single-port device, a dual-port device, or multiple devices.

The present invention will be more fully understood in view of the following description and drawings.

BRIEF DESCRIPTION OF THE DRAWINGS

FIG. 1 is a block diagram of a conventional block interleaver, which includes a 4-column by 32-row RAM.

FIG. 2 is a block diagram of a 4-column by 32-row RAM 200, which stores sequential data bits. $D_0$–$D_{127}$ in a column order.

DETAILED DESCRIPTION

Figure 3:
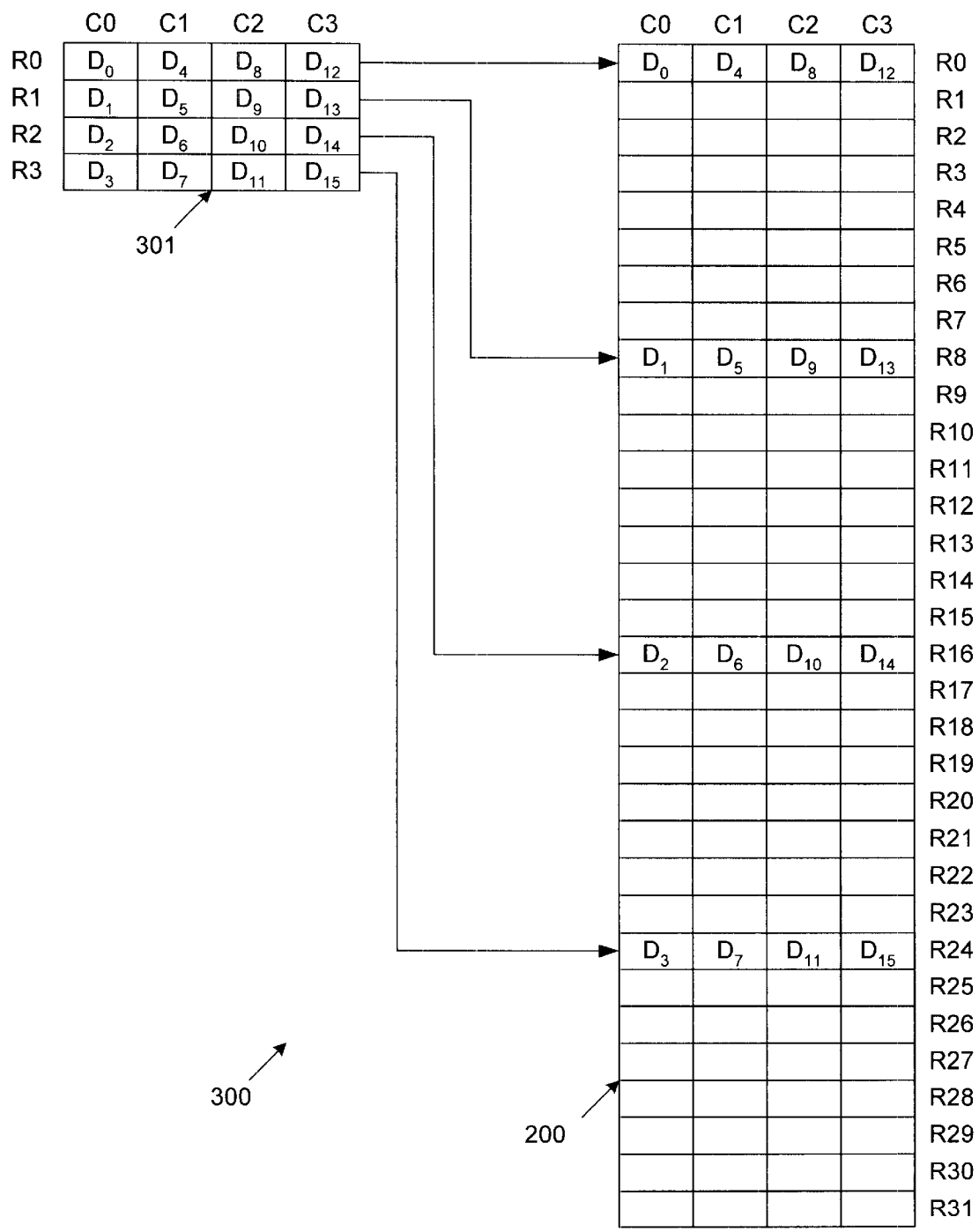
FIG. 3 is a block diagram of a block interleaver, which includes a register file and a RAM in accordance with one embodiment of the present invention.

FIG. 1 is a block diagram of a conventional block interleaver, which includes a 4-column by 32-row RAM 100. RAM 100 receives and stores data bits $D_0$–$D_{127}$ as illustrated. Data bits $D_0$–$D_{127}$ are sequentially ordered data bits, wherein $D_0$ is the first bit of a data stream, and $D_{127}$ is the last bit of the data stream. Data bits $D_0$–$D_{127}$ are stored in row order in RAM 100 in the manner described above in Table 1. That is, the first four bits of the data stream $D_0$–$D_3$ are stored in the first row of RAM 100, the next four bits of the data stream $D_4$–$D_7$ are stored in the next row of RAM 100, and so on. The data stream is loaded into RAM 100 using thirty-two 4-bit write operations.

Data bits $D_0$–$D_{127}$ are read from RAM 100 in column order in the manner described above in Table 2. Thus, 128

4-bit read operations are required to create the interleaved data stream. For example, a 4-bit read operation is performed on the first row of RAM 100, such that data bits $D_0$–$D_3$ are read. The first data bit $D_0$ is extracted and provided as the first bit of the interleaved data stream. Another 4-bit read operation is performed on the second row of RAM 100, such that data bits $D_4$–$D_7$ are read. Data bit $D_4$ is extracted and provided as the second bit of the interleaved data stream. This procedure continues until all 128 data values are read from RAM 100. The description of FIG. 1 is provided as a reference against which the present invention will be compared. As described in more detail below, the power required to interleave data bits $D_0$–$D_{127}$ using a block interleaver of the present invention will be significantly less than the power required to perform 32 4-bit write operations and 128 4-bit read operations with RAM 100.

FIG. 2 is a block diagram of a 4-column by 32-row RAM 200, which stores sequential data bits $D_0$–$D_{127}$ in a column order. That is, the data bits in the first column C0 of RAM 100 are stored in the first eight rows R0–R7 of RAM 200; the data bits in the second column C1 of RAM 100 are stored in the next eight rows R8–R15 of RAM 200; the data bits in the third column C2 of RAM 100 are stored in the next eight rows R16–R23 of RAM 200; and the data bits in the fourth column C3 of RAM 100 are stored in the last eight rows R24–R31 of RAM 200. Thus, data bits $D_0$–$D_{127}$ are stored in RAM 200 in an order that will result in the creation of an interleaved bit stream if consecutive rows are sequentially read. As can be seen, the first four bits read from the first row of RAM 200 will be $D_0$, $D_4$, $D_8$ and $D_{12}$, which are the first four bits in the left-most column C0 in RAM 100. Advantageously, RAM 200 must perform only thirty-two 4-bit read operations in order to create the interleaved data stream. In accordance with one embodiment of the present invention, the sequential data bits $D_0$–$D_{127}$ are stored in RAM 200 in the manner illustrated in FIG. 2, thereby facilitating a relatively low power set of read operations. The manner in which RAM 200 is loaded will now be described.

FIG. 3 is a block diagram of a block interleaver 300, in accordance with one embodiment of the present invention. Block interleaver 300 includes a 4×4 register file 301 and 4-column by 32-row RAM 200. In general, register file 301 is a RAM having a relatively small size when compared with RAM 200. For example, in embodiments where RAM 200 has a capacity of more than 10,000 bits, register file 301 will have a capacity of less than 1,000 bits. In a particular embodiment, RAM 200 has a capacity that is at least one order of magnitude greater than the capacity of register file 301. In another embodiment of the present invention, the ratio of the capacity of RAM 200 to the capacity of register file 301 is about 2500:1. In particular embodiments, the word size of register file 301 corresponds with the word size of an associated CPU architecture, typically from 8 to 128 bits.

Significantly, register file 301 consumes much less power than full-size RAM 200. This is because register file 301 has relatively short bit and word lines, which have relatively small capacitances. Because register file 301 has shorter bit lines than RAM 200, register file 301 does not need to implement sensitive sense amplifiers, thereby resulting in further power savings. In the described embodiment, register file 301 consumes about one to two times less power than RAM 200 for a similar operation. In addition to the power savings, the smaller size of register file 301 enables register file 301 to operate faster then RAM 200. In the described embodiments, register file 301 is one to two orders of magnitude faster than RAM 200.

Figure 4:
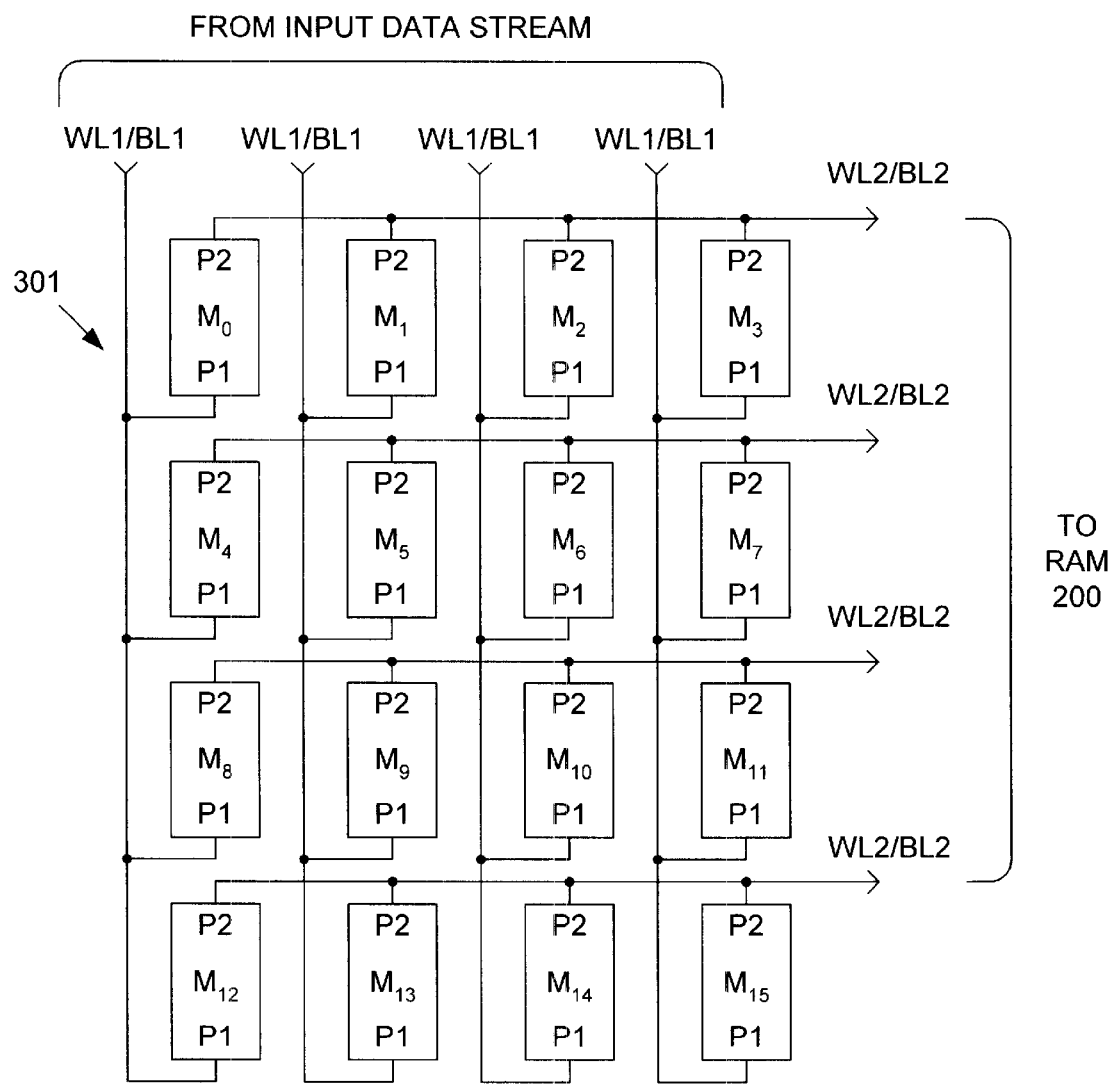
FIG. 4 is a block diagram illustrating a dual-port register file in accordance with one embodiment of the present embodiment.

FIG. 4 is a block diagram illustrating register file 301 in accordance with one embodiment of the present embodiment. In this embodiment, register file 301 is a dual-port register file. First ports (P1) of memory cells $M_0$–$M_{15}$ are configured to be accessed by column through a first set of word lines and bit lines (WL1/BL1), and the second ports (P2) of memory cells $M_0$–$M_{15}$ are configured to be accessed by row through a second set of word lines and bit lines (WL2/BL2). As a result, 4-bit write operations can be performed to transfer data bits from the incoming data stream into memory cells $M_0$–$M_{15}$ in column order through the first ports (P1) of these memory cells. Similarly, 4-bit read operations can be performed to transfer data bits from memory cells $M_0$–$M_{15}$ to RAM 200 in row order through the second ports (P2) of these memory cells in the manner described below (FIGS. 5–11). Note that it is possible, but not practical, to construct an entire block interleaver using such a dual-port RAM. This is because a dual-port RAM consumes two times more layout area than a single-port RAM. As a result, implementing an entire block interleaver using a dual-port RAM would be less efficient than interleaver RAM 100 in terms of layout area. Thus, it is only practical to implement the relatively small register file 301 using a dual-port RAM such as illustrated in FIG. 4.

Block interleaver 300 operates as follows. The first sixteen data values $D_0$–$D_{15}$ are written to register file 301 in column order. Thus, during a first 4-bit write operation, the first four data values $D_0$–$D_3$ are written to memory cells $M_0$, $M_4$, $M_8$ and $M_{12}$, respectively, through the first ports (P1) of these memory cells. This pattern continues, with the next four data values $D_4$–$D_7$ being written through the first ports of memory cells $M_1$, $M_5$, $M_9$ and $M_{13}$, respectively, during a second 4-bit write operation. The next four data values $D_8$–$D_{11}$ are then written through the first ports of memory cells $M_2$, $M_6$, $M_{10}$ and $M_{14}$, respectively, during a third 4-bit write operation. The next four data values $D_{12}$–$D_{15}$ are then written through the first ports of memory cells $M_3$, $M_7$, $M_{11}$ and $M_{15}$, respectively, during a fourth 4-bit write operation. Four 4-bit write operations must therefore be performed to fill register file 301 as illustrated in FIG. 3.

After register file 301 has been filled, the 4-bit values stored in rows R0, R1, R2 and R3 of register file 301 are transferred to rows R0, R8, R16 and R24, respectively, of RAM 200. This process requires four 4-bit read operations from register file 301 and four 4-bit write operations to RAM 200. The four write operations to RAM 200 are staggered by eight rows, thereby promoting the separation of consecutive data bits within the interleaved data stream.

Figure 5:
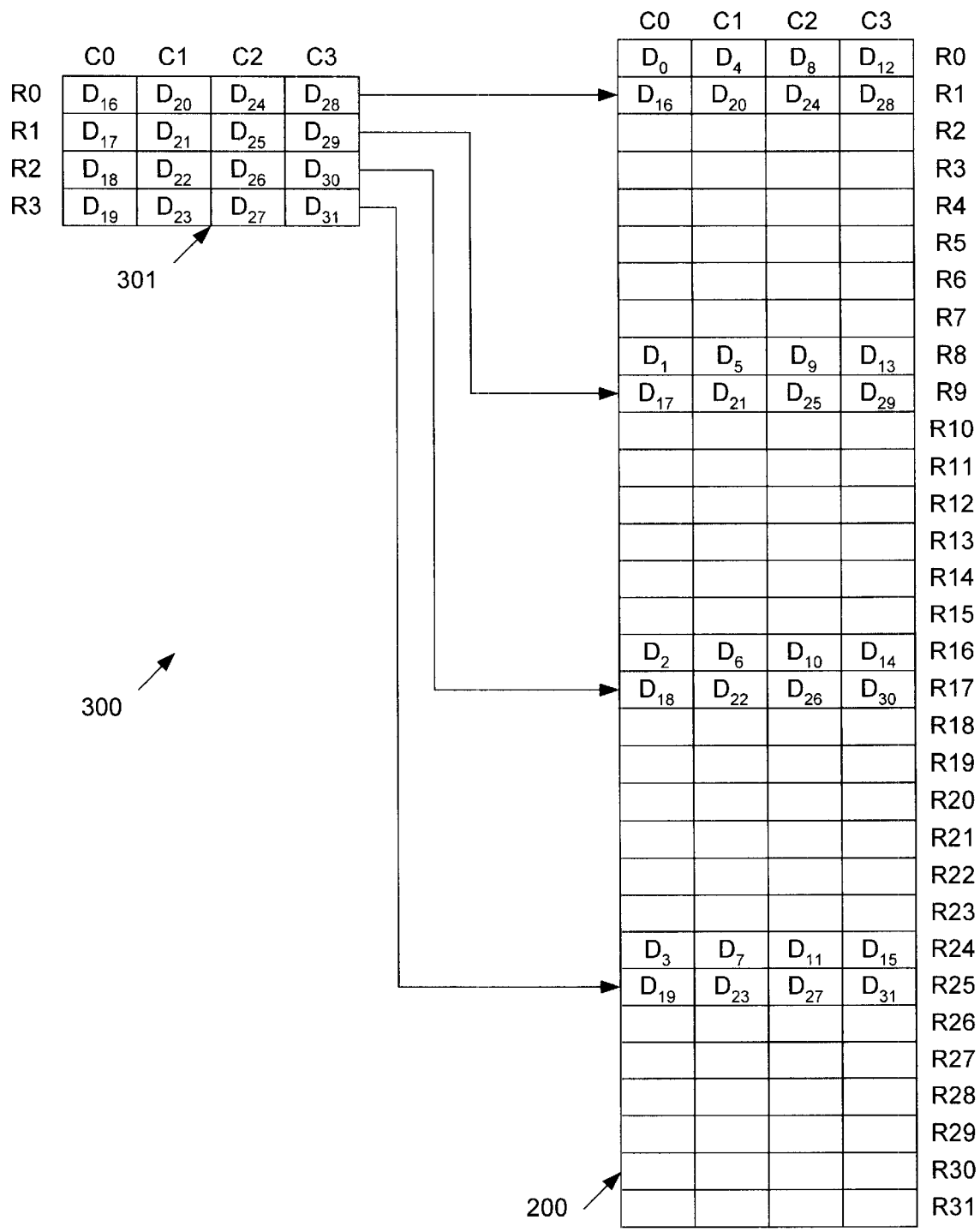
FIGS. 5–11 are block diagrams illustrating the contents of the block interleaver of FIG. 3 during successive steps of an interleaving operation.

This procedure is repeated seven more times as illustrated in FIGS. 5–11. Thus, as illustrated in FIG. 5, data values $D_{16}$–$D_{31}$ are written to register file 301 in column order, and then transferred to rows R1, R9, R17 and R25 of RAM 200 in row order.

Figure 6:
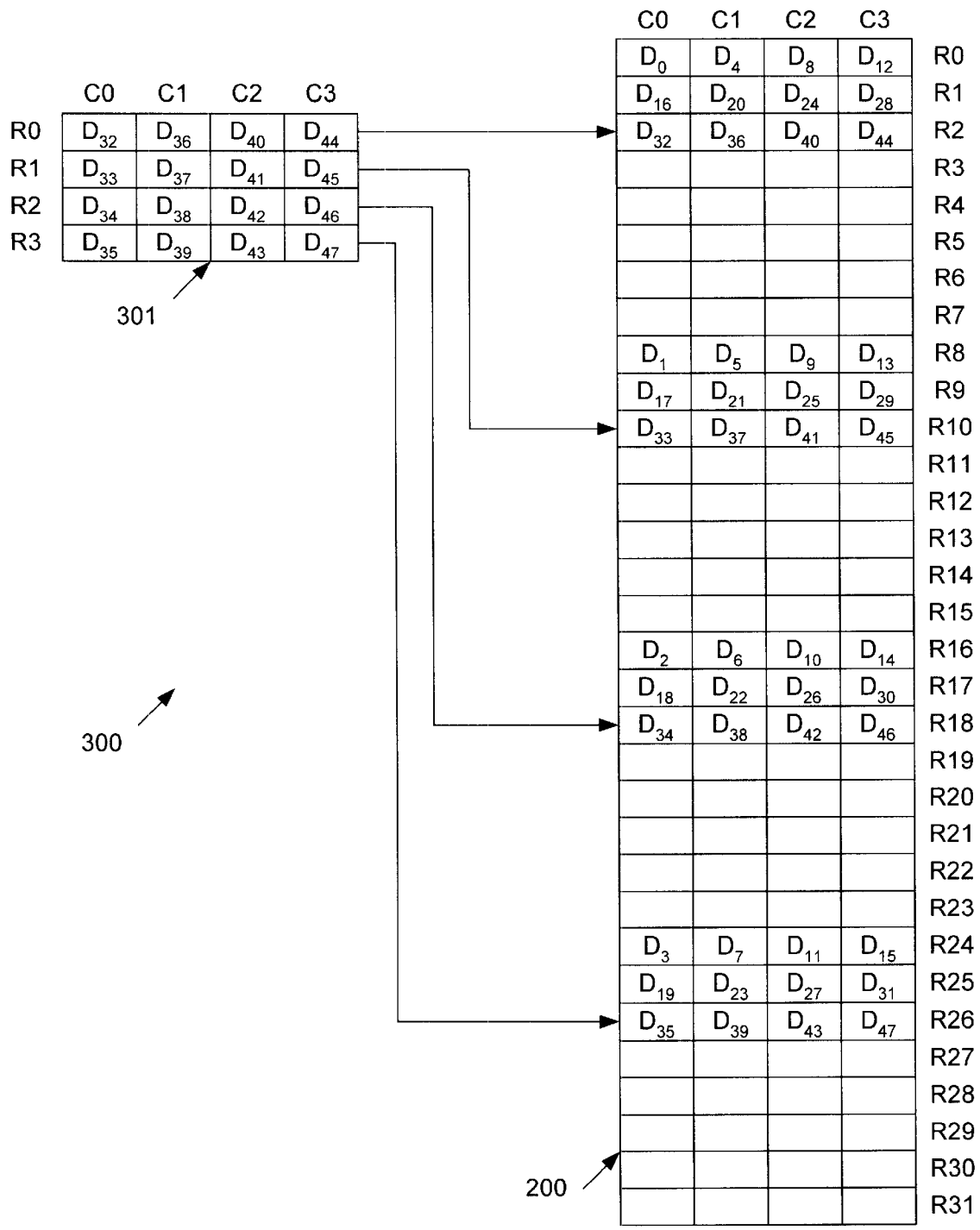

Then, as shown in FIG. 6, data values $D_{32}$–$D_{47}$ are written to register file 301 in column order, and then transferred to rows R2, R10, R18 and R26 of RAM 200 in row order.

Figure 7:
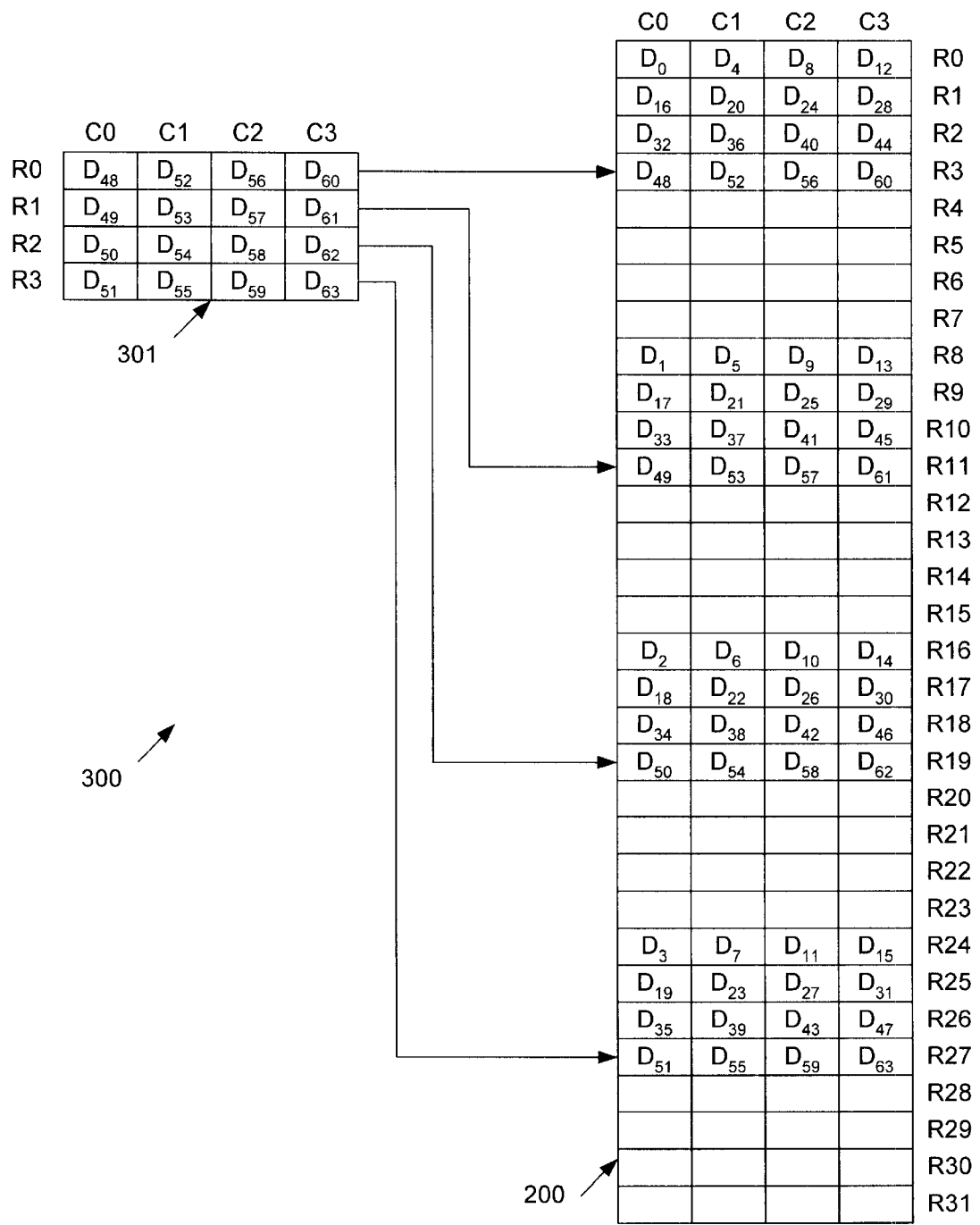

Next, as shown in FIG. 7, data values $D_{48}$–$D_{63}$ are written to register file 301 in column order, and then transferred to rows R3, R11, R19 and R27 of RAM 200 in row order.

Figure 8:
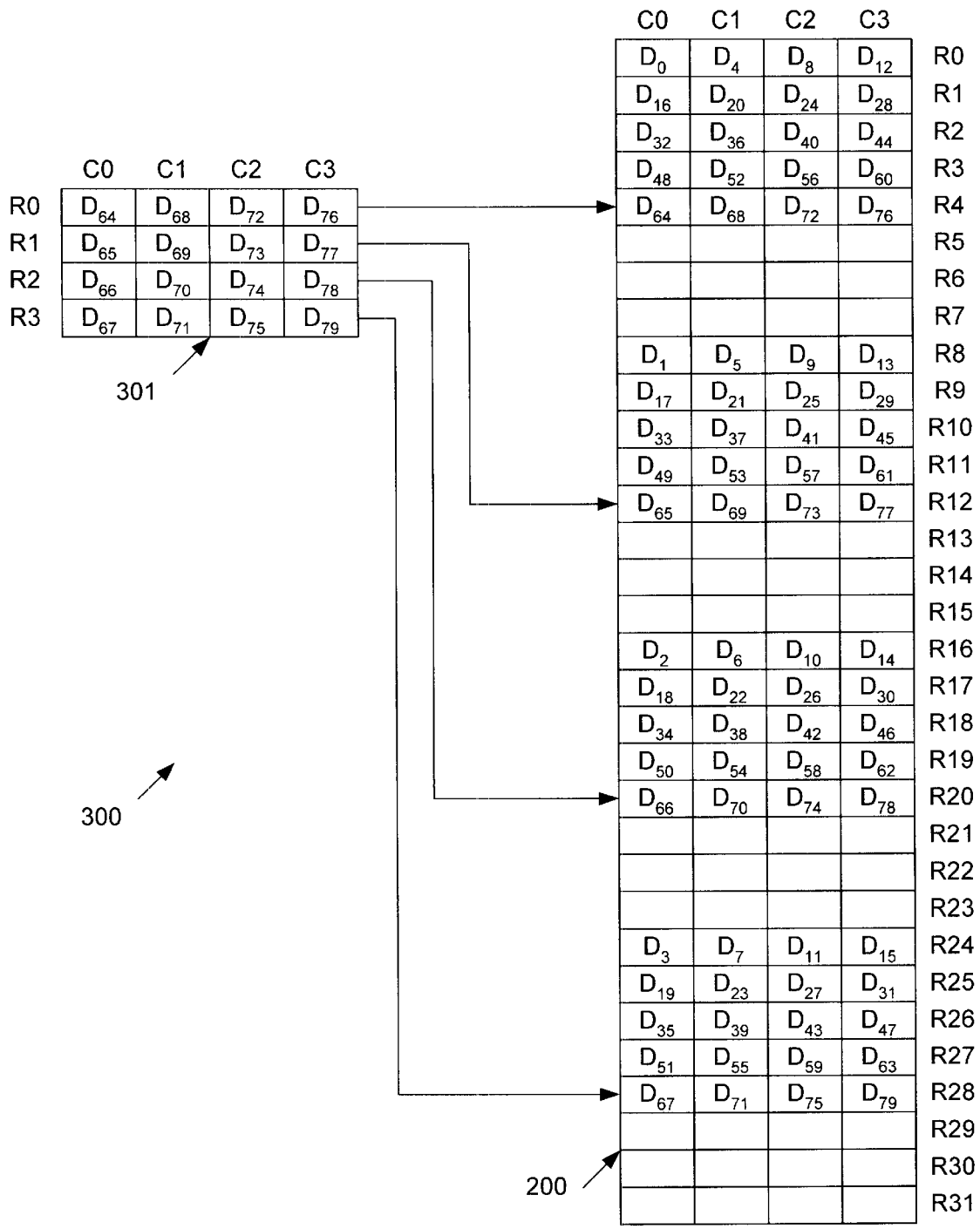

Then, as shown in FIG. 8, data values $D_{64}$–$D_{79}$ are written to register file 301 in column order, and then transferred to rows R4, R12, R20 and R28 of RAM 200 in row order.

Figure 9:
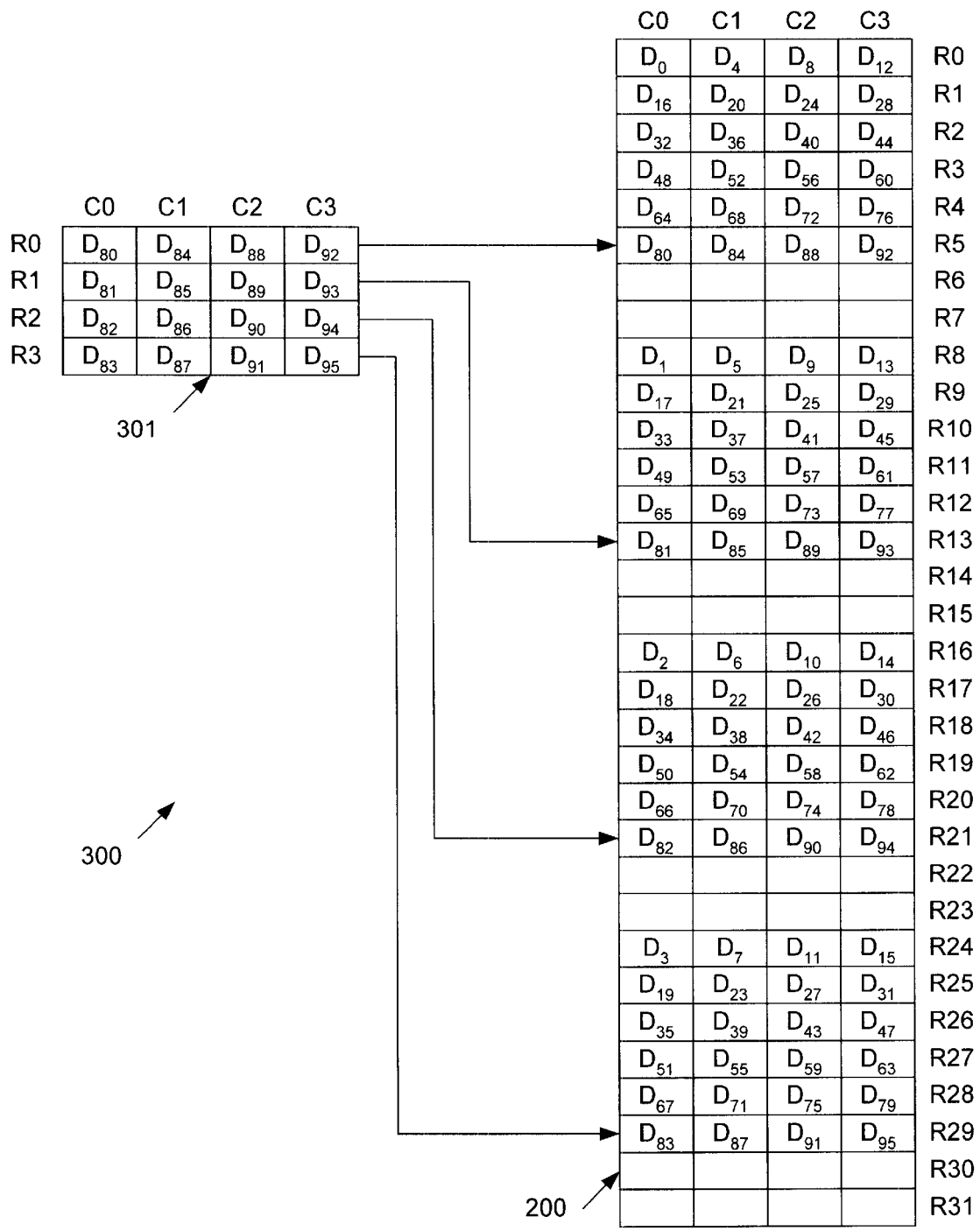

Next, as shown in FIG. 9, data values $D_{80}$–$D_{95}$ are written to register file 301 in column order, and then transferred to rows R5, R13, R21 and R29 of RAM 200 in row order.

Figure 10:
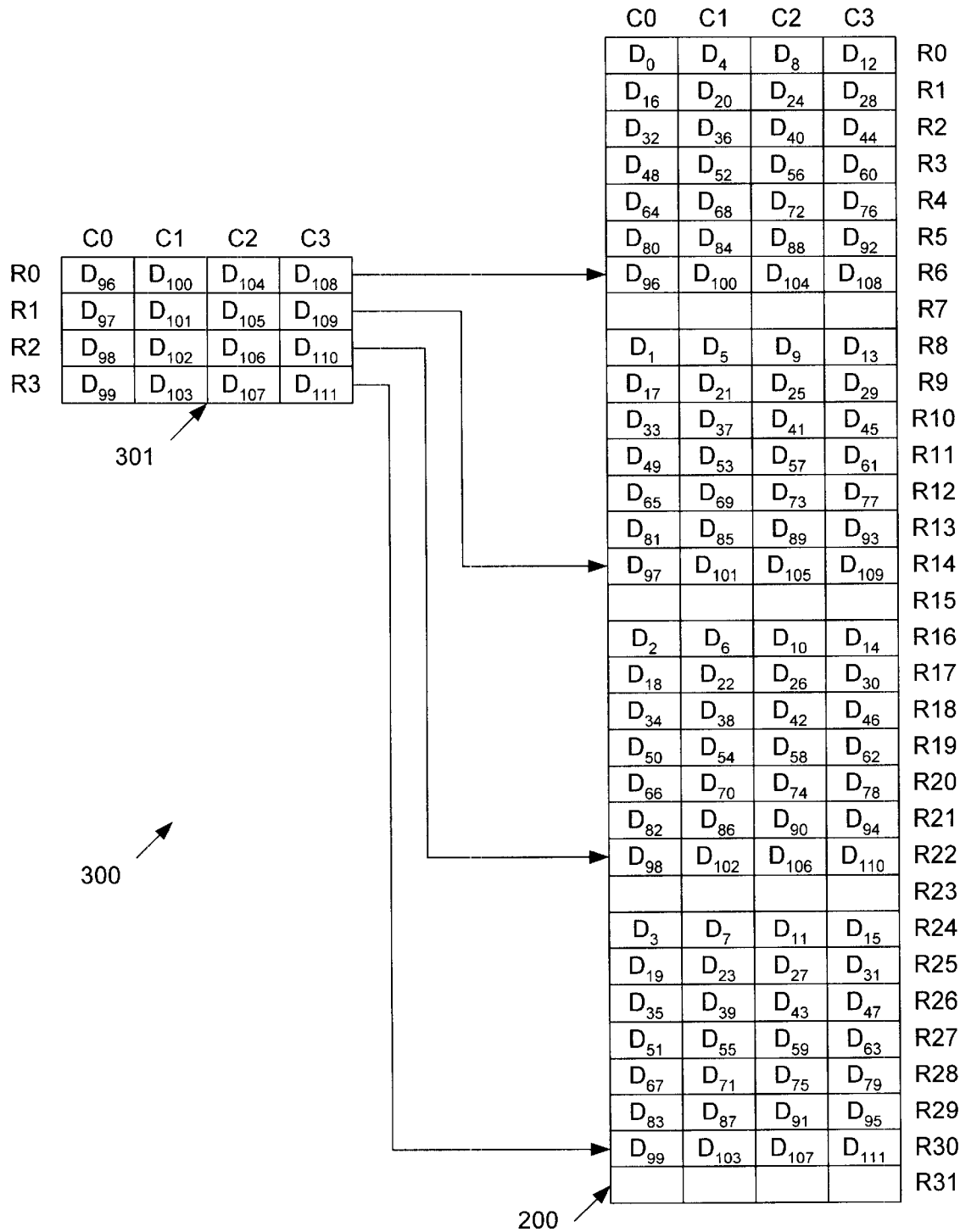

Then, as shown in FIG. 10, data values $D_{96}$–$D_{111}$ are written to register file 301 in column order, and then transferred to rows R6, R14, R22 and R30 of RAM 200 in row order.

Figure 11:
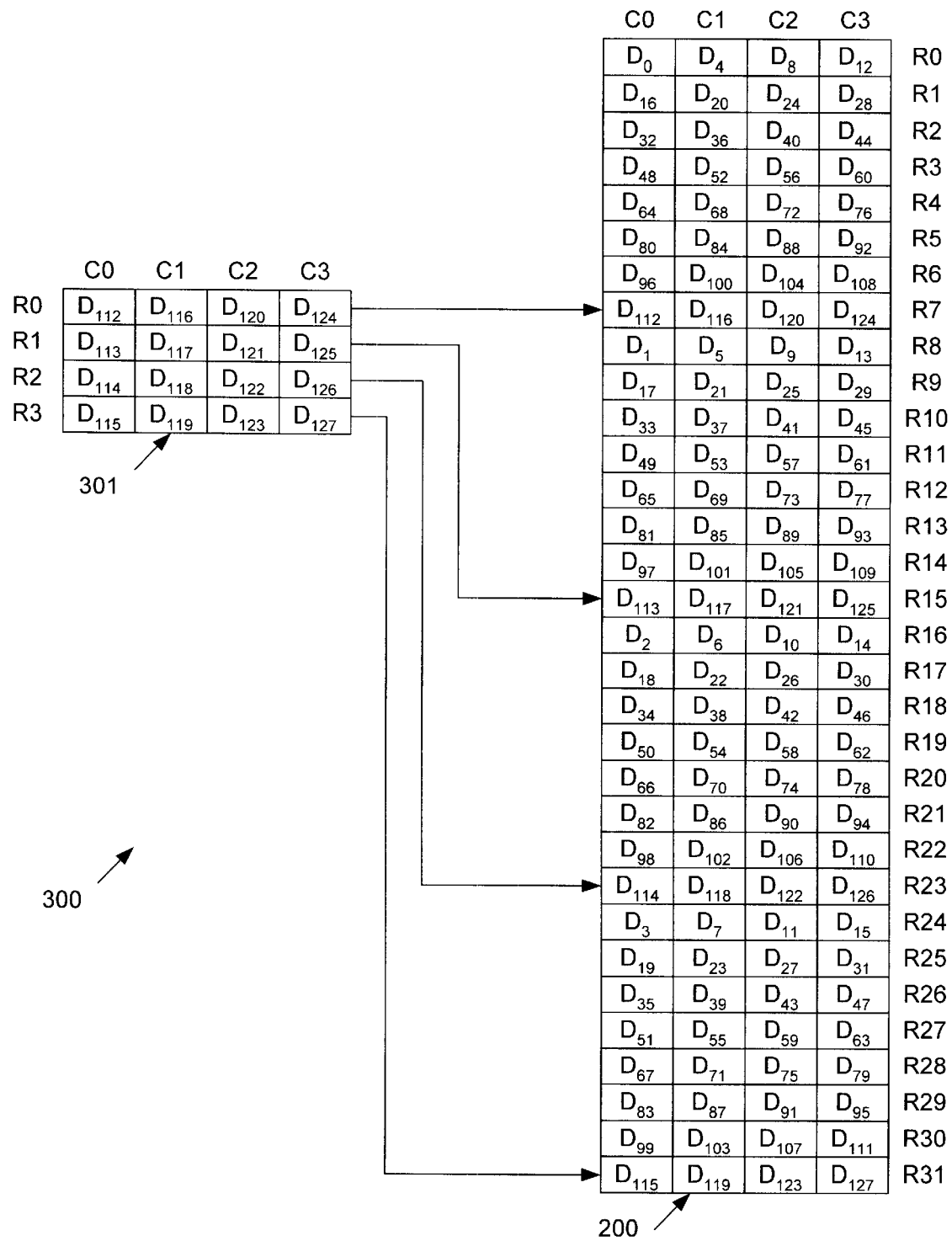

Finally, as shown in FIG. 11, data values $D_{112}$–$D_{127}$ are written to register file 301 in column order, and then transferred to rows R7, R15, R23 and R31 of RAM 200 in row order. At this time, RAM 200 stores data bits $D_0$–$D_{127}$ in the order illustrated in FIG. 2. To create an interleaved data stream, the data values stored in RAM 200 are read in row order. Thus, the first 4-bit value read from RAM 200 includes data bits $D_0$, $D_4$, $D_8$ and $D_{12}$, and the second 4-bit value read from RAM 200 includes data bits $D_{16}$, $D_{20}$, $D_{24}$ and $D_{28}$. This process continues until the contents of all 32 4-bit rows are sequentially read, thereby providing all of the data bits $D_0$–$D_{127}$ as part of the interleaved data stream. It is important to note that all accesses, read and write, to the relatively large RAM 200 utilize the full width of RAM 200. As a result, there is no power wasted by reading irrelevant data from RAM 200 or by writing irrelevant data to RAM 200.

The operation of block interleaver 300 will now be compared with the operation of interleaver RAM 100. Table 3 summarizes the operations performed by interleaver RAM 100 in order to create a 128-bit interleaved data stream.

TABLE 3

| Write Operations | Read Operations |
| --- | --- |
| 32 4-bit write operations to interleaver RAM 100 | 128 4-bit read operations from interleaver RAM 100 |

Table 4 summarizes the operations performed by block interleaver 300 in order to create the same 128-bit interleaved data stream as interleaver RAM 100.

TABLE 4

| Write Operations | Read Operations |
| --- | --- |
| 32 4-bit write operations to register file 301 | 32 4-bit read operations from register file 301 |
| 32 4-bit write operations to RAM 200 | 32 4-bit read operations from RAM 200 |

Thus, both block interleaver 300 and interleaver RAM 100 must perform 32 4-bit write operations to a 4×32 RAM. Block interleaver 300 will therefore exhibit power savings with respect to interleaver RAM 100 as long as the power required to perform 32 4-bit write operations to register file 301 plus the power required to perform 32 4-bit read operations from register file 301 is less than the power required to perform 96 (i.e., 128−32) read operations from interleaver RAM 100. This assumes that RAM 100 and RAM 200 consume the same amount of power during read and write operations.

As described above, the power required to operate register file 301 is less than 10 percent of the power required to operate RAM 200. In addition, the power required to perform the 32 4-bit write operations to register file 301 is negligible when compared with the power required for the read operations. Thus, block interleaver 300 achieves power savings of approximately 60 percent with respect to interleaver RAM 100 (i.e., interleaver RAM 100 requires 160 operations to RAM 100, while block interleaver 300 requires 64 operations to RAM 200.)

The present invention, as exemplified above, can be expanded in several ways. For example, although block interleaver 300 has been described in connection with a 4×32 RAM and a 4×4 register file, these elements can have different sizes (both in the number of columns and the number of rows) in other embodiments. For example, block interleaver 300 can be modified to have an 8×8 register file and an 8×2500 RAM. A block interleaver of this size is capable of operating in accordance with the proposed 3GPP standard.

In other embodiments, the data value being handled is not a single bit but rather a data symbol, which may include several bits. In such a case, a wider RAM is required in both the prior art and the present invention. For example, if each data bit in FIG. 1 is replaced with a 4-bit data symbol, interleaver RAM 100 would have to be expanded to a width of sixteen columns. In this case, 32 16-bit write operations and 128 16-bit read operations would be required to create an interleaved stream of 128 data symbols.

Similarly, if each data bit in FIG. 3 is replaced with a 4-bit data symbol, then both register file 301 and RAM 200 would each have to be expanded to a width of sixteen columns. In this case, 32 16-bit write operations to register file 301, 32 16-bit read operations from register file 301, 32 16-bit write operations to RAM 200 and 32 16-bit read operations from RAM 200 would be required to create the same interleaved stream of 128 data symbols as RAM 100.

In accordance with another embodiment, permutations in the column order can be accommodated, by changing the manner in which data is transferred from register file 301 to RAM 200. For example, in the example described above in connection with FIGS. 3 and 5–10, a first column (see, column C0 of FIG. 1) can be switched with a second column (see, column C1 of FIG. 1) by transferring data bits from row R0 of register file 301 to rows R8–R15 of RAM 200 (rather than rows R0–R7), and transferring data bits from row R1 of register file 301 to rows R0–R7 of RAM 200 (rather than rows R8–R15).

Although register file 301 has been described as a dual-port device, it is possible to implement register file 301 as a single-port device in another embodiment of the present invention. For example, register file 301 can be implemented as a single-port RAM that can be written in column order (1-bit write operations) and read in row order (4-bit read operations). Because such a single-port device requires more write operations than a dual-port device, the single-port device is not as efficient as the dual-port device.

In another embodiment, register file 301 can be implemented using two or more register files working in parallel. In such an embodiment, while a first set of data values is written into one register file, a second set of data values is trasferred from another register file into RAM 200.

Figure 12:
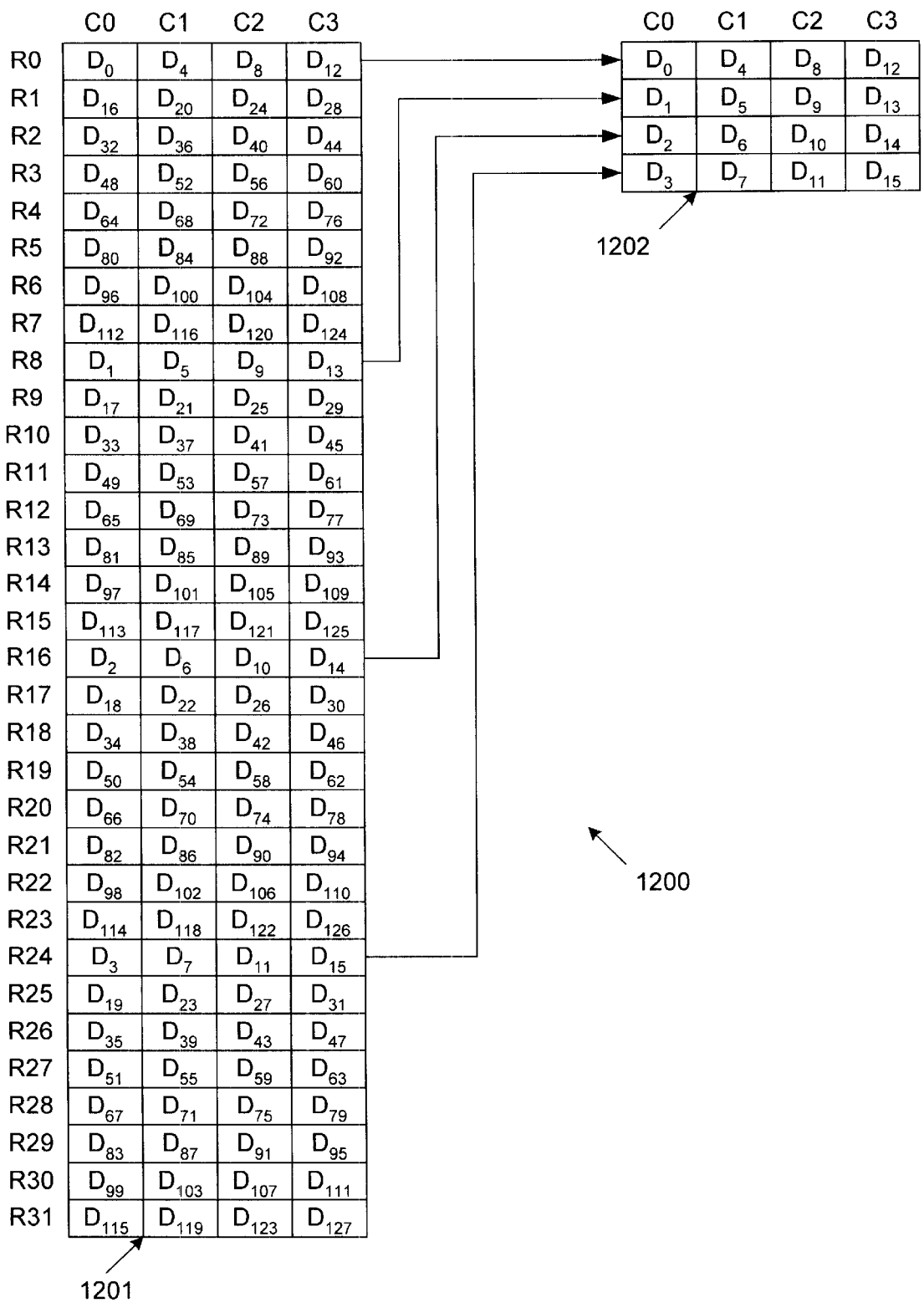
FIG. 12 is a block diagram of a block de-interleaver which receives the data stream provided by the block interleaver of FIG. 3 in accordance with one embodiment of the present invention.

The present invention can also be modified to perform a de-interleaving operation. FIG. 12 is a block diagram illustrating a de-interleaver 1200 which receives the data stream provided by block interleaver 300. De-interleaver 1200 includes a 4-column by 32-row RAM 1201 and a 4-column by 4-row register file 1202. Data bits of the interleaved data stream are written to RAM 1201 in row order using thirty-two 4-bit write operations. At this time, the contents of RAM 1201 are identical to the contents of RAM 200 at the end of the interleaving process (FIG. 10).

The data bits stored in rows R0, R8, R16 and R24 are read from RAM 1201 using four 4-bit read operations. Thus, de-interleaver 1200 staggers the rows of these read operations in the same manner that block interleaver 300 staggers the rows of the write operations to RAM 200 during the interleaving process. The data bits read from rows R0, R8, R16 and R24 of RAM 1201 are written to register file 1202 in row order using four 4-bit write operations. At this time, register file 1202 stores data bits $D_0$–$D_{15}$ in column order.

These data bits D0–D15 are read from register file 1202 in column order using four 4-bit read operations. As a result, register file 1200 provides data bits $D0-D_{15}$ of the original data stream in their original (de-interleaved) order. The remaining data bits $D_{16}-D_{127}$ are transferred from RAM 1201 to register file 1202 in row order, and are read out of register file 1202 in column order in a similar manner, thereby reconstructing the entire original data stream $D_0-D_{127}$. It is important to note that all accesses, read and write, to the relatively large RAM 1201 utilize the full width of RAM 1201. As a result, there is no power wasted by reading irrelevant data from RAM 1201 or by writing irrelevant data to RAM 1201.

De-interleaver 1200 can be expanded or modified in the same ways described above for block interleaver 300.

Although the invention has been described in connection with several embodiments, it is understood that this invention is not limited to the embodiments disclosed, but is capable of various modifications which would be apparent to a person skilled in the art. For example, although RAM 200 has been described as having the same width as register file 301, this is not necessary. In fact, the width of RAM 200 can be larger or smaller than the width of register file 301 in other embodiments. In addition, the described block interleaver can be easily modified to implement the $1^{st}$ Interleaver of the 3GPP standards. This interleaver has a variable size, which is a function of the size of the data block to be transferred. In particular, the number of columns can be 1 (i.e., no interleaving is performed), 2, 4 or 8. In addition to the interleaving achieved by writing in rows and reading in columns, the columns can also be permuted. Thus, the invention is limited only by the following claims.

What is claimed is:

1. A method of interleaving a stream of sequential data values, the method comprising the steps of:

receiving the stream of sequential data values with a first memory having a first size;

storing the data values in a column order in the first memory;

reading the data values from the first memory in a row order;

writing the data values read from the first memory to a second memory in a row order, wherein the second memory has a second size that is larger than the first size; and reading the data values from the second memory in a row order, thereby creating an interleaved data stream.

2. The method of claim 1, wherein the second memory is larger than the first memory by at least one order of magnitude.

3. The method of claim 1, wherein the first memory and the second memory have the same column width.

4. The method of claim 1, wherein the step of storing the data values in the column order in the first memory requires more memory accesses than the step of reading the data values from the first memory in the row order.

5. The method of claim 1, wherein the step of writing the data values read from the first memory to the second memory in a row order is performed such that the data values are written to staggered rows of the second memory.

6. The method of claim 5, wherein the step of reading the data values from the second memory in a row order is performed such that the data values are read from consecutive rows of the second memory.

7. The method of claim 5, wherein the step of writing the data values read from the first memory to the second memory in a row order is performed such that the data values in the interleaved data stream have a permuted column order.

8. The method of claim 1, wherein the step of storing the data values in the column order in the first memory requires the same number of memory accesses as the step of reading the data values from the first memory in the row order.

9. The method of claim 1, wherein the second memory has a width, wherein the data values read from the first memory and written to the second memory have a width equal to the width of the second memory.

10. The method of claim 9, wherein the data values read from the second memory have a width equal to the width of the second memory.

11. A method of de-interleaving a stream of interleaved data values, the method comprising the steps of:

receiving the stream of interleaved data values with a first memory having a first size;

storing the interleaved data values in a row order in the first memory;

reading the interleaved data values from the first memory in a row order;

writing the interleaved data values read from the first memory to a second memory in a row order, wherein the second memory has a second size that is smaller than the first size; and reading the interleaved data values from the second memory in a column order, thereby creating a de-interleaved data stream.

12. The method of claim 11, wherein the first memory is smaller than the second memory by at least one order of magnitude.

13. The method of claim 11, wherein the first memory and the second memory have the same column width.

14. The method of claim 11, wherein the step of reading the interleaved data values from the second memory requires more memory accesses than the step of writing the interleaved data values read from the first memory to the second memory.

15. The method of claim 11, wherein the step of reading the interleaved data values from the first memory in a row order is performed such that the interleaved data values are read from staggered rows of the first memory.

16. The method of claim 15, wherein the step of reading the interleaved data values from the second memory in a row order is performed such that the interleaved data values are read from consecutive rows of the second memory.

17. The method of claim 15, wherein the step of writing the interleaved data values read from the first memory to the second memory in a row order is performed to eliminate a permuted column order of the interleaved data stream.

18. The method of claim 11, wherein the step of reading the interleaved data values from the second memory requires the same number of memory accesses as the step of writing the interleaved data values read from the first memory to the second memory.

19. The method of claim 11, wherein the first memory has a width, wherein the interleaved data values read from the first memory and written to the second memory have a width equal to the width of the first memory.

20. The method of claim 19, wherein the interleaved data values written to the first memory have a width equal to the width of the first memory.

21. A block interleaver comprising:

a first memory having a first size, wherein the first memory is coupled to receive a sequential data stream of data values, the first memory being configured to store the data values in a column order and output the data values in a first row order; and a second memory having a second size larger than the first size, the second memory being configured to store the data values output by the first memory in a second row order and output the data values in a third row order.

22. The block interleaver of claim 21, wherein the first memory is single-port RAM.

23. The block interleaver of claim 21, wherein the first memory is a dual-port RAM.

24. The block interleaver of claim 21 wherein the first memory and the second memory have the same width.

25. The block interleaver of claim 21, wherein the second row order is a staggered row order, and the third row order is a sequential row order.

26. The block interleaver of claim 21, wherein the second size is at least one order of magnitude larger than the first size.

27. The block interleaver of claim 21, wherein the first memory consumes less power than the second memory.

28. The block interleaver of claim 21, wherein the first memory is faster than the second memory.

29. A block de-interleaver comprising:

a first memory having a first size, wherein the first memory is coupled to receive an interleaved stream of data values, the first memory being configured to store the data values in a first row order and output the data values in a second row order; and a second memory having a second size smaller than the first size, the second memory being configured to store the data values output by the first memory in a third row order and output the data values in a column.

30. The block de-interleaver of claim 29, wherein the second memory is single-port RAM.

31. The block de-interleaver of claim 29, wherein the second memory is a dual-port RAM.

32. The block de-interleaver of claim 29 wherein the first memory and the second memory have the same width.

33. The block de-interleaver of claim 29, wherein the first row order is a sequential row order, and the second row order is a staggered row order.

34. The block de-interleaver of claim 29, wherein the second size is at least one order of magnitude smaller than the first size.

35. The block de-interleaver of claim 29, wherein the second memory consumes less power than the first memory.

36. The block de-interleaver of claim 29, wherein the second memory is faster than the first memory.

* * * * *